United States Patent
Su et al.

(10) Patent No.: US 12,438,131 B2
(45) Date of Patent: Oct. 7, 2025

(54) DISPLAY APPARATUS

(71) Applicant: Industrial Technology Research Institute, Hsinchu (TW)

(72) Inventors: Wei-Sheng Su, New Taipei (TW); Chia-Hsin Chao, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 687 days.

(21) Appl. No.: 17/561,991

(22) Filed: Dec. 26, 2021

(65) Prior Publication Data
US 2022/0384396 A1 Dec. 1, 2022

Related U.S. Application Data

(60) Provisional application No. 63/194,189, filed on May 28, 2021.

(30) Foreign Application Priority Data

Nov. 25, 2021 (TW) .................................. 110143969

(51) Int. Cl.
*H10K 59/13* (2023.01)
*H01L 25/075* (2006.01)
(Continued)

(52) U.S. Cl.
CPC ........ *H01L 25/0753* (2013.01); *H10H 20/857* (2025.01); *H10H 20/8581* (2025.01); *H10K 59/131* (2023.02)

(58) Field of Classification Search
CPC .... H10K 59/131; H10K 59/179; H10K 59/18; G09G 2300/0426; H01L 33/62; H01L 25/0753; G02F 1/133528
See application file for complete search history.

(56) References Cited

U.S. PATENT DOCUMENTS

| 10,152,914 B2 | 12/2018 | Meersman et al. |
| 2015/0270438 A1* | 9/2015 | Sugihara ............... G02F 1/1333 438/27 |

(Continued)

FOREIGN PATENT DOCUMENTS

| CN | 1516532 | 7/2004 |
| CN | 101500373 | 8/2009 |

(Continued)

OTHER PUBLICATIONS

"Notice of allowance of Taiwan Counterpart Application", issued on Sep. 26, 2022, p. 1-p. 4.

*Primary Examiner* — Eric K Ashbahian
(74) *Attorney, Agent, or Firm* — JCIPRNET

(57) ABSTRACT

Provided is a display apparatus including a transparent substrate, display modules on the transparent substrate, an interconnect, a cover layer and a control device. The display module includes a first circuit board, LED devices and a molding layer. The first circuit board has first and second surfaces opposite to each other, and is disposed on the transparent substrate with the first surface facing the transparent substrate. The LED devices are disposed on the first surface and electrically connected to the first circuit board. The molding layer is disposed on the first surface to cover the LED devices. The interconnect is disposed in the first circuit board and on the second surface to electrically connect the display modules to each other. The cover layer covers the display modules and the interconnect. The control device is electrically connected to a portion of the interconnect adjacent to the edge of the transparent substrate.

13 Claims, 10 Drawing Sheets

(51) Int. Cl.
*H10H 20/857* (2025.01)
*H10H 20/858* (2025.01)
*H10K 59/131* (2023.01)

(56) References Cited

U.S. PATENT DOCUMENTS

| | | | |
|---|---|---|---|
| 2016/0267836 A1* | 9/2016 | Meersman | H05K 5/0021 |
| 2017/0025593 A1 | 1/2017 | Bower et al. | |
| 2017/0140679 A1 | 5/2017 | Tomoda et al. | |
| 2018/0040268 A1* | 2/2018 | Murai | G02F 1/133512 |
| 2019/0165035 A1 | 5/2019 | Fu | |
| 2019/0339570 A1* | 11/2019 | Chen | G02F 1/13336 |
| 2020/0211929 A1* | 7/2020 | Son | G09F 9/3026 |
| 2020/0343463 A1* | 10/2020 | Lee | H10K 59/131 |
| 2021/0066389 A1* | 3/2021 | Chen | H10H 20/855 |
| 2021/0183840 A1* | 6/2021 | Wang | H05K 1/0281 |
| 2023/0238500 A1* | 7/2023 | Cho | H01L 25/0753 |
| | | | 257/79 |

FOREIGN PATENT DOCUMENTS

| | | |
|---|---|---|
| CN | 110048012 | 7/2019 |
| CN | 110456550 | 11/2019 |
| CN | 111048656 | 4/2020 |
| CN | 112201739 | 1/2021 |
| TW | I692280 | 4/2020 |
| TW | 202030533 | 8/2020 |

\* cited by examiner

DISPLAY APPARATUS

CROSS-REFERENCE TO RELATED APPLICATION

This application claims the priority benefit of U.S. provisional application Ser. No. 63/194,189, filed on May 28, 2021, and Taiwan application serial no. 110143969, filed on Nov. 25, 2021. The entirety of each of the above-mentioned patent applications is hereby incorporated by reference herein and made a part of this specification.

BACKGROUND

Technical Field

The present disclosure relates to a display apparatus, and particularly relates to a display apparatus comprising a plurality of display modules.

Description of Related Art

With the expansion of the application field and the increase of the content of the information transmitted, the technology and the form of the displays are gradually diversified, and thus the consumers' requirements for the displays are also increasing. For large-size display apparatuses, a display apparatus is usually formed by tiling a plurality of display modules on a substrate.

In the current large-size display apparatuses, the driving devices are usually disposed on the back side of the display module, so that the display apparatus has large thickness and weight. In addition, the display modules tiled on the substrate are usually electrically connected to each other through the circuit layers disposed on the substrate. Therefore, the regions between adjacent display modules are usually large and invalid regions (non-display regions). As a result, the display performance of the display apparatus is affected.

SUMMARY

An embodiment of the present disclosure provides a display apparatus including a transparent substrate, display modules on the transparent substrate, an interconnect, a cover layer and a control device. The display module includes a first circuit board, LED devices and a molding layer. The first circuit board has first and second surfaces opposite to each other, and is disposed on the transparent substrate with the first surface facing the transparent substrate. The LED devices are disposed on the first surface and electrically connected to the first circuit board. The molding layer is disposed on the first surface to cover the LED devices. The interconnect is disposed in the first circuit board and on the second surface to electrically connect the display modules to each other. The cover layer covers the display modules and the interconnect. The control device is electrically connected to a portion of the interconnect adjacent to the edge of the transparent substrate.

To make the aforementioned more comprehensible, several embodiments accompanied with drawings are described in detail as follows.

DESCRIPTION OF THE EMBODIMENTS

Figure 1A:
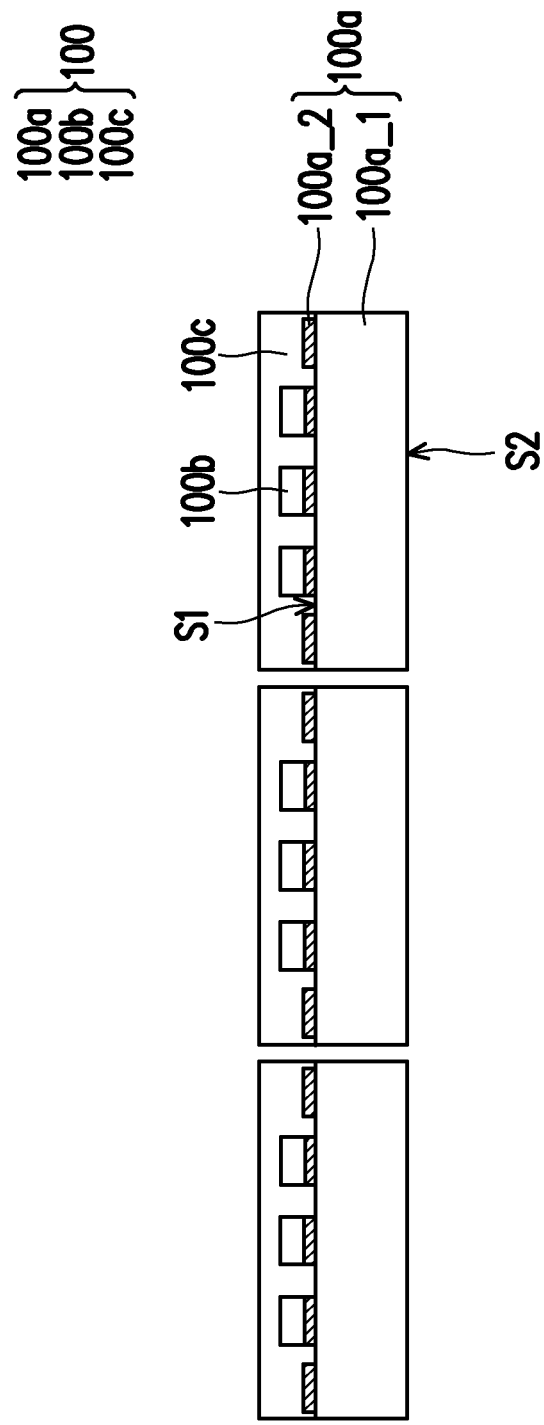
FIGS. 1A to 1E are schematic cross-sectional views of the manufacturing process of the display apparatus of an embodiment of the present disclosure.

The embodiments are described in detail below with reference to the accompanying drawings, but the embodiments are not intended to limit the scope of the present disclosure. In addition, the drawings are for illustrative purposes only and are not drawn to the original dimensions. For the purpose of easy understanding, the same elements in the following description will be denoted by the same reference numerals.

The terms mentioned in the text, such as "comprising", "comprising" and "having" are all open-ended terms, i.e., meaning "comprising but not limited to".

When using terms such as "first" and "second" to describe a device, it is only used to distinguish these devices from each other, and does not limit the order or importance of these devices. Therefore, in some cases, the first device can also be called the second device, and the second device can also be called the first device, and this does not deviate from the scope of the present disclosure.

In addition, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

FIGS. 1A to 1E are schematic cross-sectional views of the manufacturing process of the display apparatus of an embodiment of the present disclosure. Referring to FIG. 1A, a plurality of display modules 100 are provided. In the present embodiment, the display modules 100 are the same as each other, but the present disclosure is not limited thereto. The display module 100 is, for example, a light emitting diode (LED) module, which may comprise a first circuit board 100a, a plurality of LED devices 100b and a molding layer 100c. The first circuit board 100a may be one of the various well-known circuit boards, and may be a flexible circuit board or a rigid circuit board, which is not limited by the present disclosure. The first circuit board 100a may comprise an insulating layer 100a_1 and a circuit layer 100a_2. The insulating layer 100a_1 has a first surface S1 and a second surface S2 opposite to each other, and the circuit layer 100a_2 is disposed on the first surface S1. Therefore, the first surface S1 may be regarded as the front surface of the first circuit board 100a, and the second surface S2 may be regarded as the back surface of the first circuit board 100a. In addition, other circuit layers and conductive vias connecting the circuit layers may also be selectively disposed in the insulating layer 100a_1, which is not limited by the present disclosure. The LED devices 100b are disposed on the circuit layer 100a_2 to be electrically connected to the first circuit board 100a. The molding layer 100c is disposed on the first surface S1 to cover the LED devices 100b and the circuit layer 100a_2.

Figure 1B:
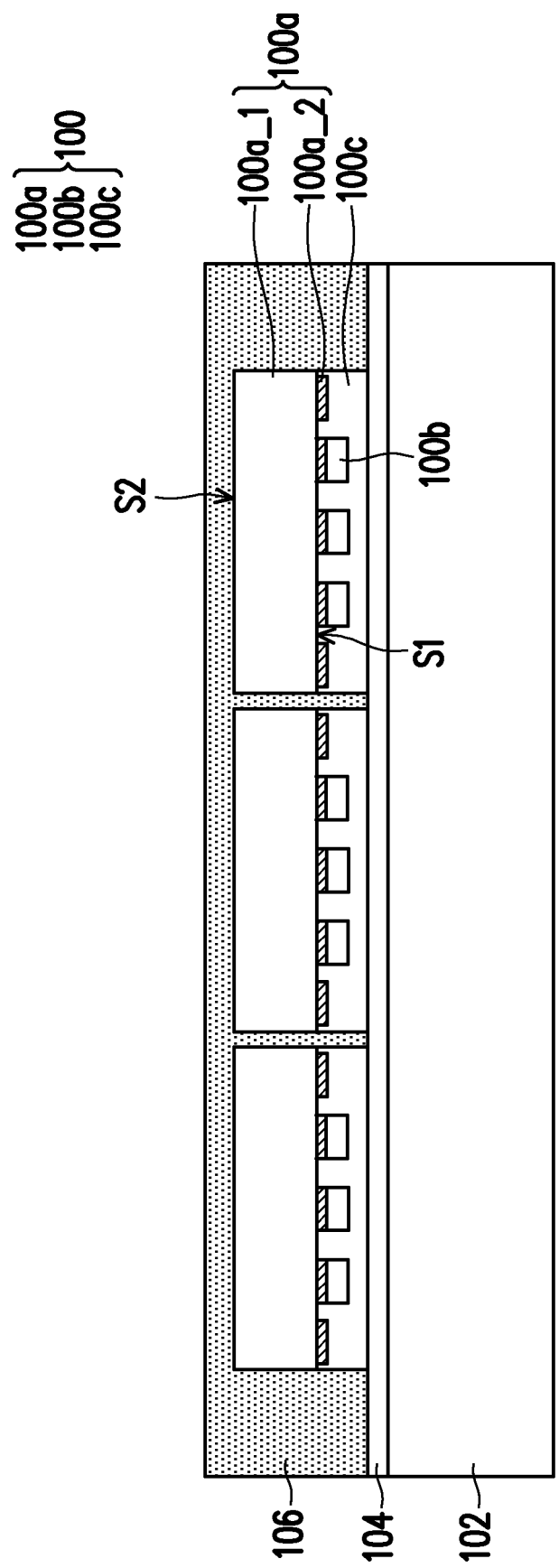

Referring to FIG. 1B, a transparent substrate 102 is provided. In the present embodiment, the transparent substrate 102 is, for example, a glass substrate, but the present disclosure is not limited thereto. Then, an adhesion layer 104 is optionally formed on the transparent substrate 102. The adhesion layer 104 may be a transparent adhesion layer to facilitate the penetration of the light emitted by the LED devices 100b. The material of the adhesion layer 104 is, for example, acrylic or silicone. Then, the display modules 100 are bonded to the transparent substrate 102 with the first surface S1 facing the transparent substrate 102. In this way, the adhesion layer 104 is disposed between the molding layer 100c and the transparent substrate 102, so that the display modules 100 may be firmly attached to the transparent substrate 102. In other embodiments, the display modules 100 may be bonded to the transparent substrate 102 through other suitable means, which is not limited by the present disclosure. After that, an optical glue 106 is optionally formed on the surface of the transparent substrate 102. The optical glue 106 covers the display modules 100 and fills the space between two adjacent display modules 100. In order to avoid affecting the luminous efficacy of the display modules 100, the optical glue 106 is preferably a transparent optical glue. The material of the optical glue 106 may be a polymer material, such as silicon.

Figure 1C:
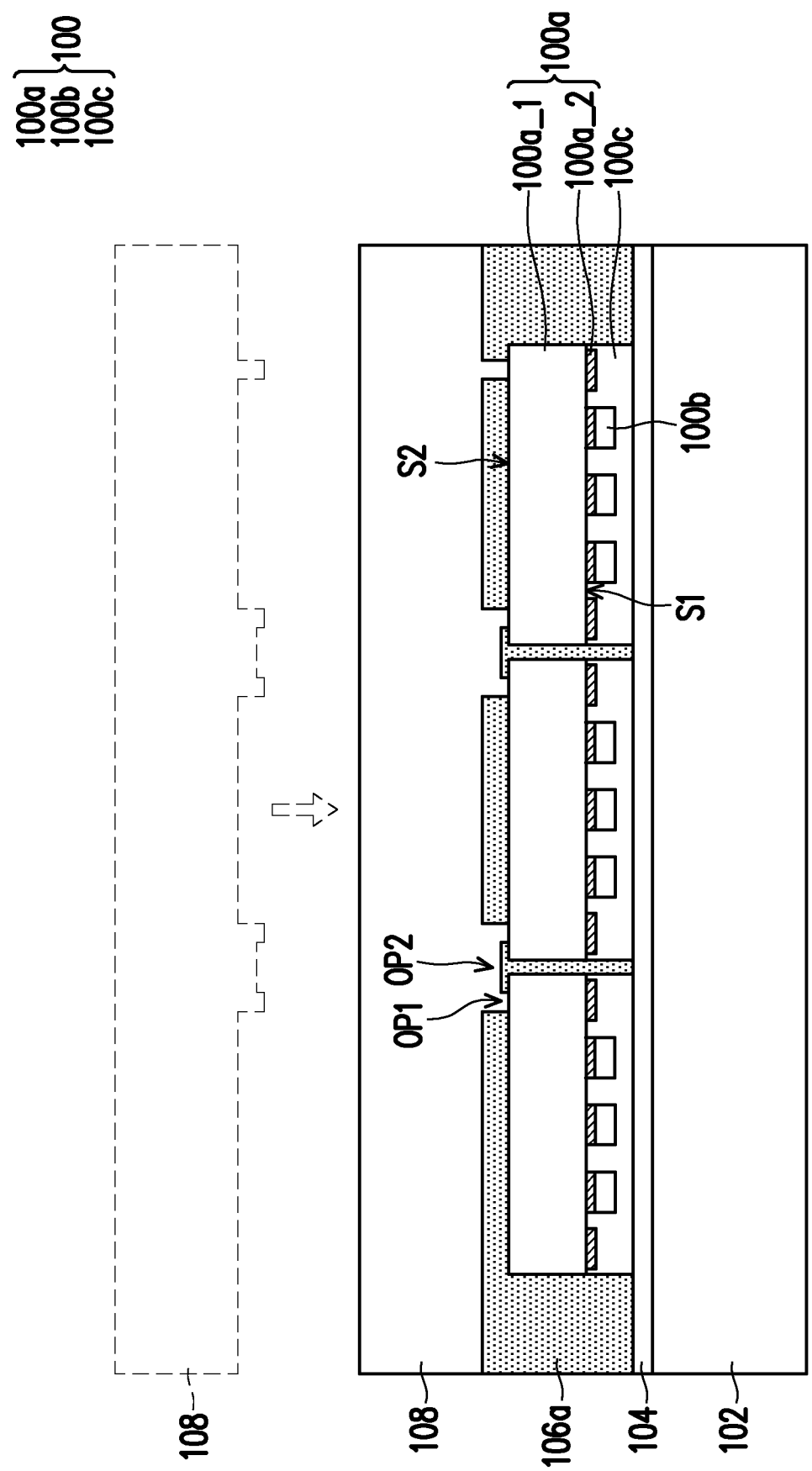

Referring to FIG. 1C, a mold 108 is used to imprint the optical glue 106 to form a patterned optical glue 106a. The mold 108 has a pattern corresponding to an interconnect to be formed. In detail, after the imprinting process, the formed patterned optical glue 106a has openings OP1 that expose a part of the second surface S2 and openings OP2 that do not expose the second surface S2. The opening OP2 is located between two adjacent openings OP1. The openings OP1 and openings OP2 correspond to the regions of the interconnect to be formed. In the present embodiment, the openings OP1 and the openings OP2 are located at the edge of the display module 100 to facilitate subsequent electrical connection of two adjacent display modules 100.

Figure 1D:
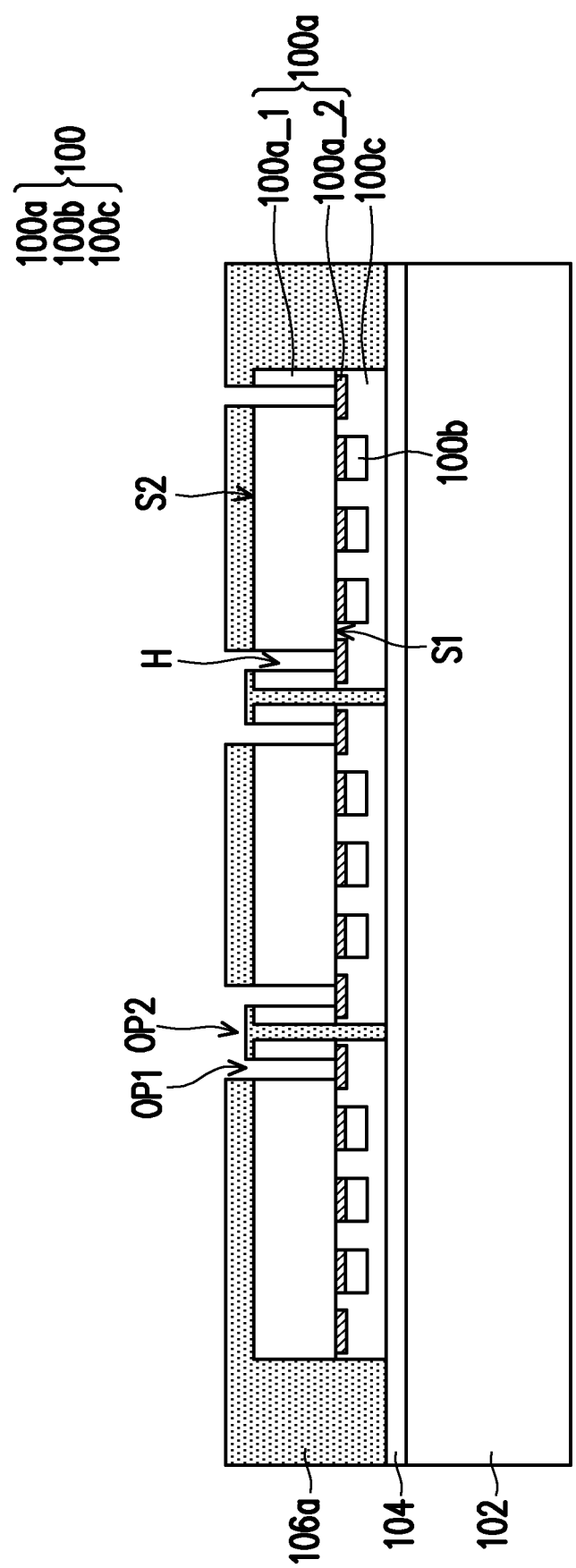
Figure 6:
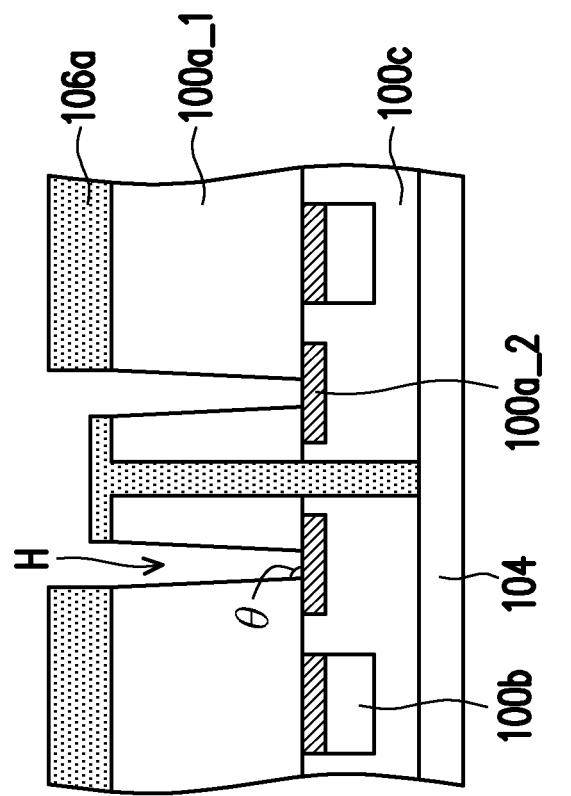
FIG. 6 is a schematic cross-sectional view of the opening of another embodiment of the present disclosure.

Referring to FIG. 1D, the mold 108 is removed. Then, the patterned optical glue 106a is used as a mask. A laser drilling process may be performed to form holes H in the insulating layer 100a_1. The holes H expose a part of the circuit layer 100a_2 on the first surface S1. In the present embodiment, the upper width of the hole H is equal to the lower width of the hole H, but the present disclosure is not limited thereto. In other embodiments, the upper width of the hole H may be greater than the lower width of the hole H. That is, the angle θ between the bottom surface of the hole H and the sidewall of the hole H is an obtuse angle, for example, greater than 90 degrees and less than 135 degrees, as shown in FIG. 6.

Figure 1E:
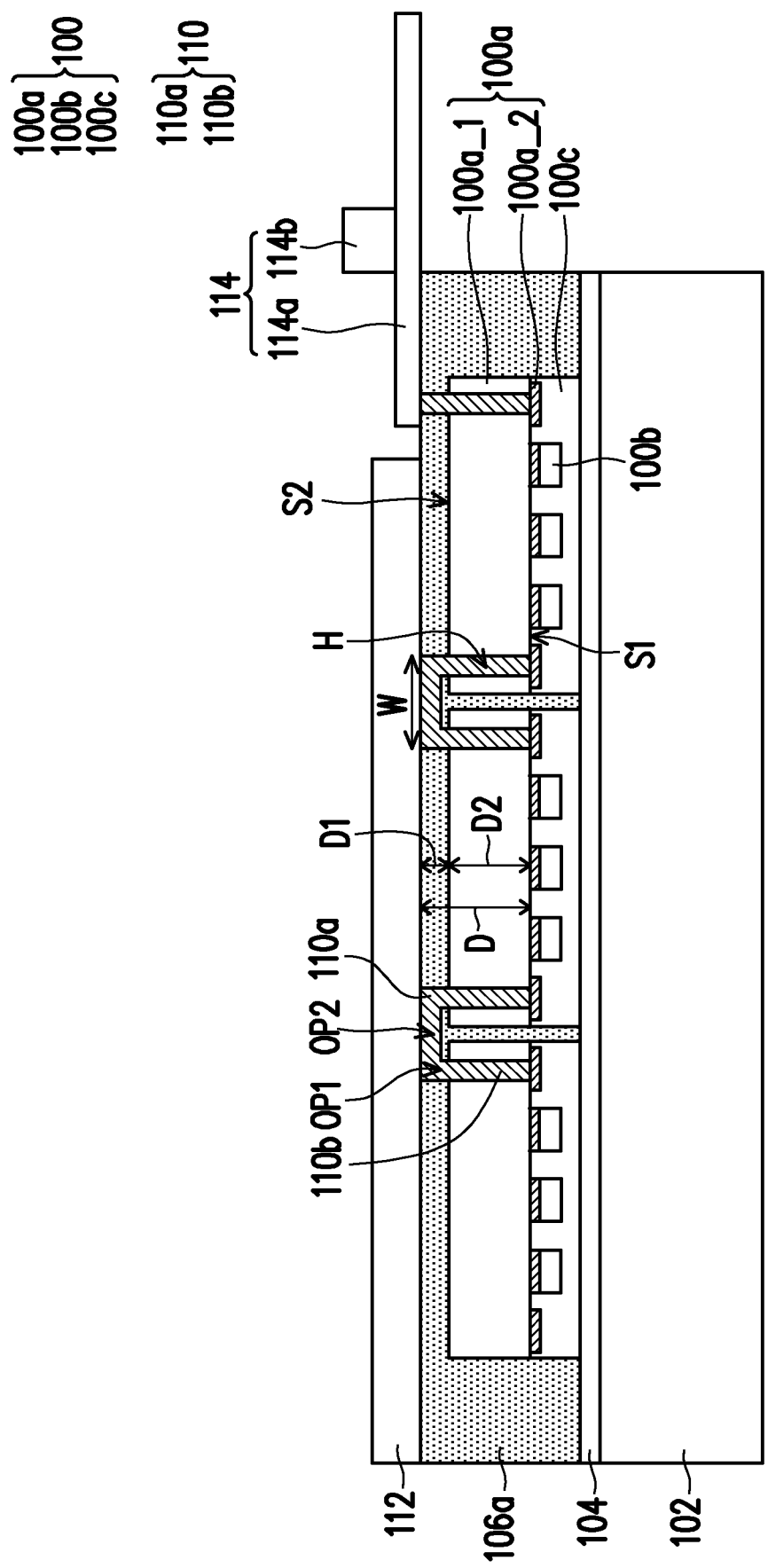

Referring to FIG. 1E, a conductive material is filled in the openings OP1, the openings OP2 and the holes H to form an interconnect 110. The conductive material is, for example, conductive glue or metal. In an embodiment, the conductive material may be silver paste. In the present embodiment, the conductive material filled in the openings OP1 and the openings OP2 may be used as circuit layers 110a, and the conductive material filled in the holes H may be used as conductive vias 110b. In other words, in the present embodiment, the interconnect 110 comprises the circuit layers 110a located on the second surface S2 and the conductive vias 110b located in the insulating layer 100a_1. The circuit layers 110a and the LED devices 100b may be electrically connected through the conductive vias 110b.

Next, a cap layer 112 is formed. The cap layer 112 covers the display modules 100 and the interconnect 110 to prevent the display modules 100 and the interconnect 110 from being damaged. The material of the cap layer 112 is, for example, silicon glue, thermally conductive adhesive, ultraviolet curing adhesive or insulating varnish. In addition, the thickness of the cap layer 112 is smaller than the thickness of the first circuit board 100a to avoid increasing the thickness of the display apparatus.

In the present embodiment, the circuit layer 110a located on the second surface S2 has width W connected between two adjacent display modules 100 and thickness D1, and the conductive via 110b located in the insulating layer 100a_1 has thickness D2. The total thickness of the thickness D1 and the thickness D2 is D, and the ratio of width W to total thickness D is between 1 and 100. In this way, the electrical quality of the interconnect 110 with low impedance and high uniformity may be ensured, and too deep and too small holes H may be avoided and thus the yield of laser drilling may be improved. In an embodiment, the width W is, for example, between 2 um and 200 um, and the total thickness D is, for example, between 2 um and 20 um.

Figure 2:
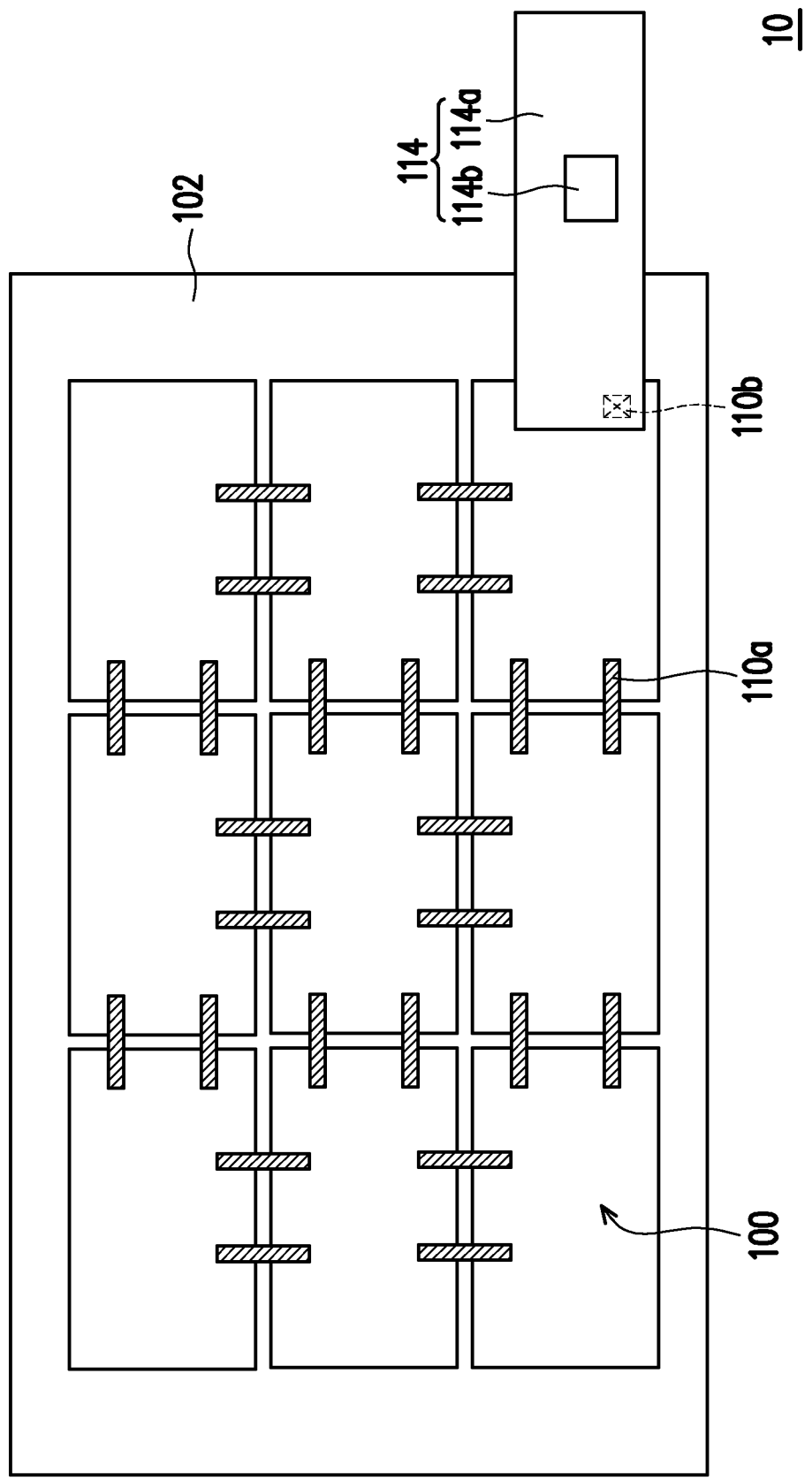
FIG. 2 is a schematic top view of the display apparatus in FIG. 1E.

Next, a control device 114 that may control the display modules 100 is formed at the edge of the transparent substrate 102. The control device 114 is electrically connected to the portion of the interconnect 110 adjacent to the edge of the transparent substrate 102. In this way, a display apparatus 10 of the present embodiment is formed. In the present embodiment, the control device 114 is electrically connected to the conductive via 110b of one outermost display module 100. FIG. 2 is a schematic top view of the display apparatus in FIG. 1E. In FIG. 2, for making the drawing clear and ease of description, the adhesion layer 104, the patterned optical glue 106a and the cap layer 112 are not shown. As shown in FIG. 2, in the display apparatus 10, a plurality of display modules 100 are disposed on the transparent substrate 102 in an array and are electrically connected to each other through the interconnect 110, and the control device 114 is electrically connected to one outermost display module 100. In the present embodiment, the control device 114 may be a commonly known chip-on-film (COF) circuit board, which may comprise a second circuit board 114a electrically connected to the interconnect 110 and a control circuit 114b disposed on the second circuit board 114a and electrically connected to the second circuit board 114a, but the present disclosure is not limited thereto. In an embodiment, the control circuit 114b is, for example, a control integrated circuit (IC). In addition, in the present embodiment, the second circuit board 114a is flexible, but the present disclosure is not limited thereto.

In the display apparatus 10, compared to the first circuit board 100a and the portion of the cap layer 112 on the second surface S2, the transparent substrate 102 has a larger thickness, so the transparent substrate 102 may be used as a carrier substrate of the display modules 100, and the light emitted by the display modules 100 may penetrate through the transparent substrate 102 as the carrier substrate.

In addition, the display module 100 is disposed on the transparent substrate 102 with the front surface facing the transparent substrate 102, and the circuit layers 110a of the interconnect 110 is disposed on the back surface of the display modules 100. In this way, when the plurality of display modules 100 are tiled on the transparent substrate 102, the display modules 100 may be as close as possible and electrically connected to each other through the interconnect 110, so that the invalid regions (non-display regions) may be greatly reduced, thereby improving the display performance of the display apparatus 10.

In addition, the adjacent display modules 100 are electrically connected to each other through the interconnect 110 disposed on the back surface of the display modules 100, so there is no need to additionally dispose a circuit board on the back surface of the display modules 100 to achieve the purpose of electrical connection. As a result, the thickness and the weight of the display apparatus 10 may be effective reduced. The control device 114 may be disposed at the edge of the display apparatus 10 through an electrical connection with the interconnect 110 adjacent to the edge of the transparent substrate 102, so that the influence on the tiling layout of the display modules 100 may be reduced.

Figure 3:
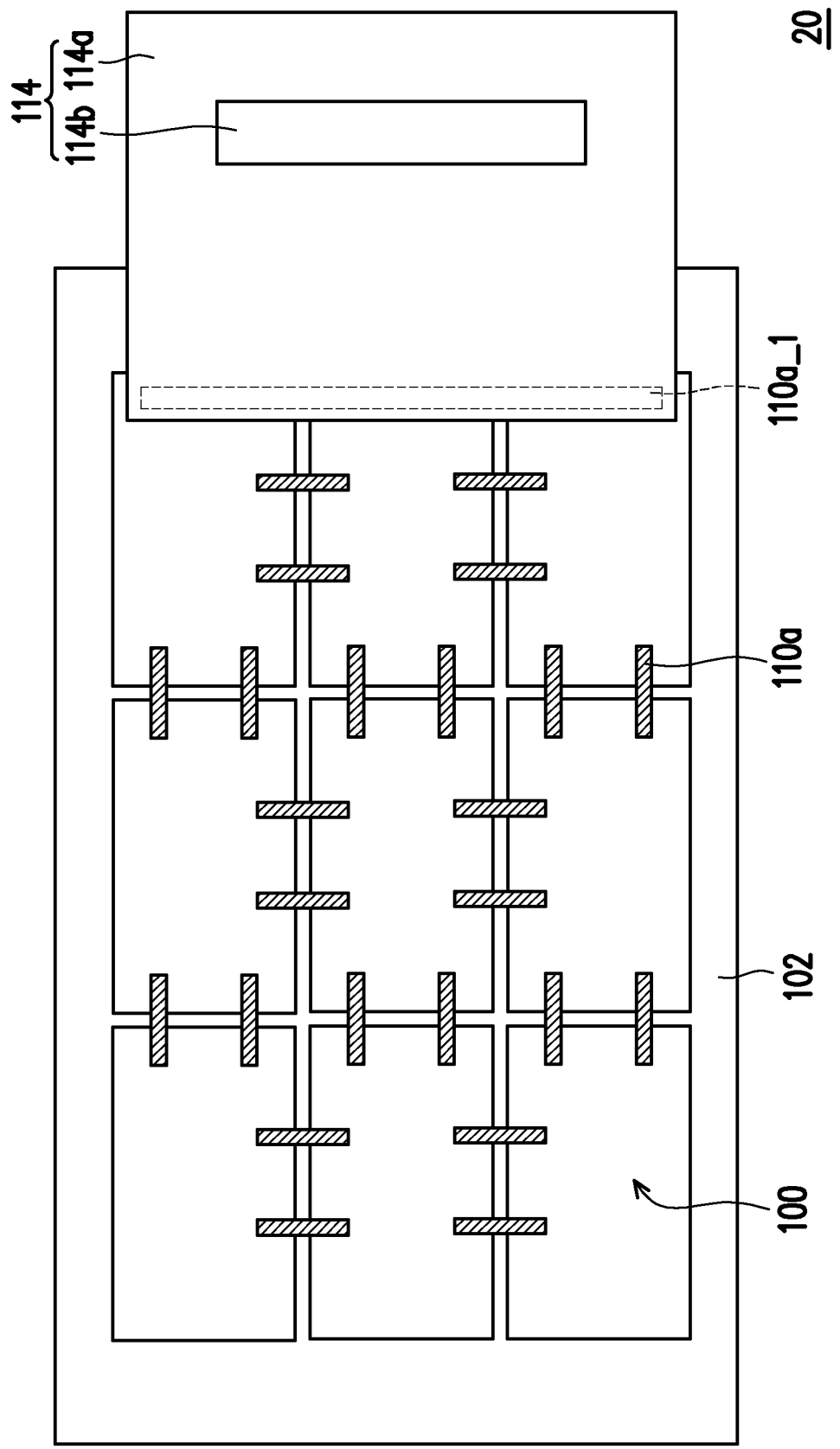
FIG. 3 is a schematic top view of the display apparatus of another embodiment of the present disclosure.

In the present embodiment, the control device 114 is connected to only one display module 100 adjacent to the edge of the transparent substrate 102, but the present disclosure is not limited thereto. In other embodiments, a plurality of display modules 100 adjacent to the edge of the transparent substrate 102 may be connected through a specific circuit pattern of the interconnect 110, and the control device 114 is connected to the specific circuit pattern. FIG. 3 is a schematic top view of the display apparatus of another embodiment of the present disclosure. As shown in FIG. 3, in the display apparatus 20, a specific circuit pattern 110a_1 of the interconnect 110 is adjacent to the edge of the transparent substrate 102 and is connected to three display modules 100, and the control device 114 is disposed at the edge of the display apparatus 10 and is connected to the specific circuit pattern 110a_1.

Figure 4:
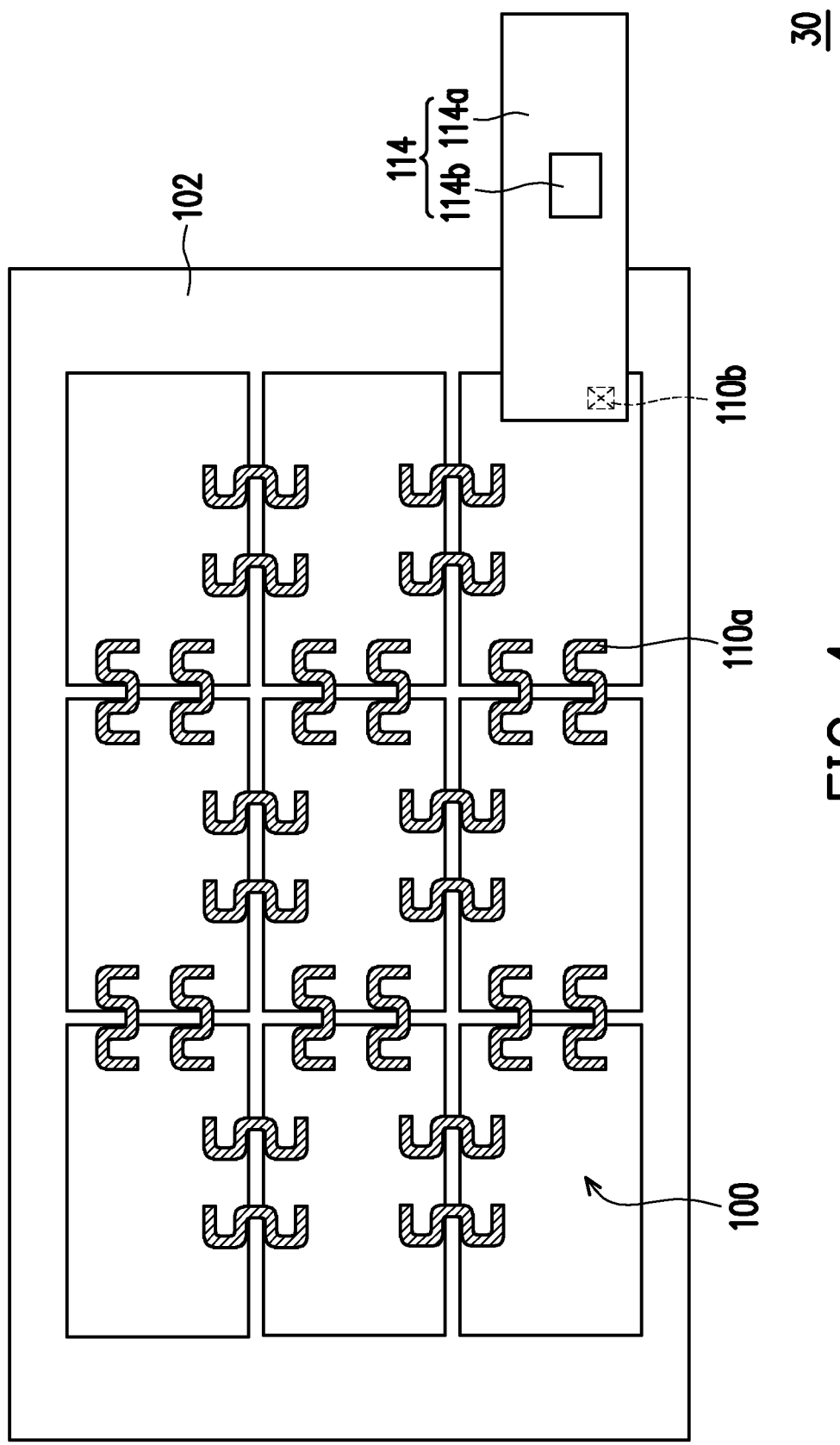
FIG. 4 is a schematic top view of the display apparatus of another embodiment of the present disclosure.

In addition, in the above embodiments, the portion of the circuit layer 110a connecting the two adjacent display modules 100 has a linear shape when viewed from a top view, but the present disclosure is not limited thereto. FIG. 4 is a schematic top view of the display apparatus of another embodiment of the present disclosure. As shown in FIG. 4, in the display apparatus 30, when viewed from a top view, the portion of the circuit layer 110a connecting two adjacent display modules 100 has a curved shape. In this way, when the display apparatus 30 is stretched or compressed by an external force, the curved portion of the circuit layer 110a may be similar to a spring and has a stress-absorbing effect to prevent the circuit layer 110a from breaking, or the display apparatus 30 may have the effect of a foldable (flexible) display apparatus.

Figure 5:
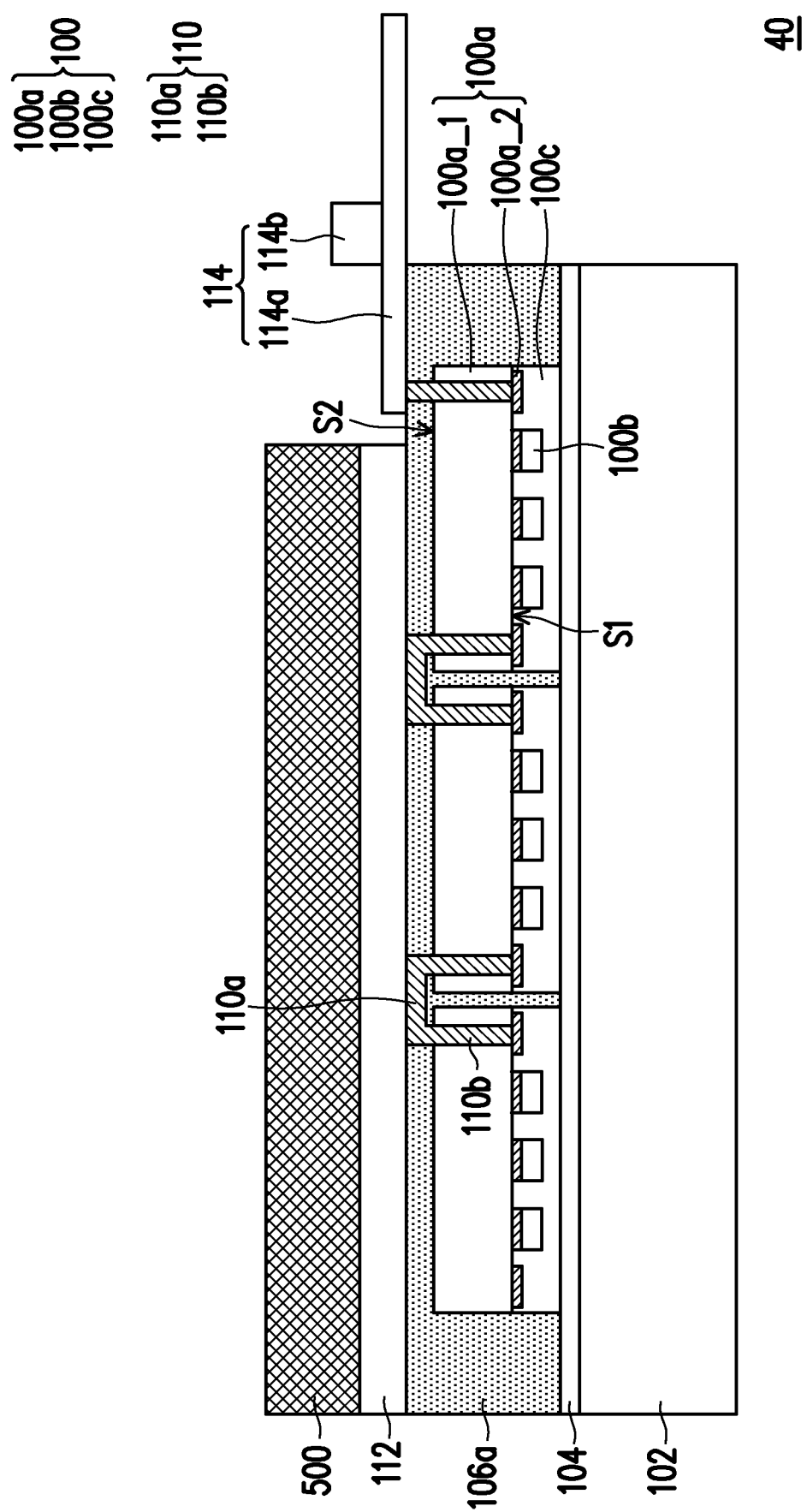
FIG. 5 is a schematic cross-sectional view of the display apparatus of another embodiment of the present disclosure.

FIG. 5 is a schematic cross-sectional view of the display apparatus of another embodiment of the present disclosure. Referring to FIG. 5, the difference between the display apparatus 40 of the present embodiment and the display apparatus 10 is that: the display apparatus 40 further comprises a heat-dissipation substrate 500 disposed on the cap layer 112. The material of the heat-dissipation substrate 500 is, for example, aluminum, copper or graphite. In the present embodiment, the heat-dissipation substrate 500 is located above the display modules 100. As a result, during the operation of the display apparatus 40, the heat-dissipation substrate 500 may effectively dissipate the heat generated by the display modules 100.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, comprising:
    a transparent substrate;
    a plurality of display modules, disposed on the transparent substrate, wherein each of the plurality of display modules comprises:
        a first circuit board, having a first surface and a second surface opposite to each other, and disposed on the transparent substrate with the first surface facing the transparent substrate;
        a plurality of light emitting diode (LED) devices, disposed on the first surface and electrically connected to the first circuit board; and
        a molding layer, disposed on the first surface to cover the plurality of LED devices;
    an interconnect, disposed in the first circuit board and on the second surface to electrically connect the plurality of display modules to each other;
    a cap layer, covering the plurality of display modules and the interconnect; and
    a control device, electrically connected to a portion of the interconnect adjacent to the edge of the transparent substrate,
    wherein the interconnect comprises:
        a circuit layer, disposed on the second surface to connect two adjacent display modules; and
        a conductive via, disposed in the first circuit board to electrically connect the circuit layer and the plurality of LED devices, and
    wherein an optical glue is located between the interconnect and the second surface, and located between two adjacent conductive vias respectively in two adjacent first circuit boards.

2. The display apparatus of claim 1, wherein the thickness of the first circuit board is greater than the thickness of the cap layer.

3. The display apparatus of claim 1, wherein the thickness of the transparent substrate is greater than the thickness of the first circuit board.

4. The display apparatus of claim 1, wherein the control device comprises:
    a second circuit board, electrically connected to the interconnect; and
    a control circuit, disposed on the second circuit board and electrically connected to the second circuit board.

5. The display apparatus of claim 4, wherein the second circuit board is flexible.

6. The display apparatus of claim 1, wherein a portion of the circuit layer connecting the two adjacent display modules has a width, the circuit layer and the conductive via have a total thickness, and the ratio of the width to the total thickness is between 1 and 100.

7. The display apparatus of claim 6, wherein the width is between 2 um and 200 um, and the total thickness is between 2 um and 20 um.

8. The display apparatus of claim 1, wherein when viewed from a top view, a portion of the circuit layer that connects the two adjacent display modules is curved.

9. The display apparatus of claim 1, further comprising an optical glue disposed between two adjacent display modules.

10. The display apparatus of claim 1, further comprising a heat-dissipation substrate disposed on the cap layer.

11. The display apparatus of claim 10, wherein the material of the heat-dissipation substrate comprises aluminum, copper or graphite.

12. The display apparatus of claim 1, further comprising an adhesion layer disposed between the molding layer and the transparent substrate.

13. The display apparatus of claim 1, wherein the transparent substrate is flexible.

* * * * *